(12) United States Patent
Mittan et al.

(10) Patent No.: US 7,893,948 B1
(45) Date of Patent: Feb. 22, 2011

(54) FLEXIBLE PIXEL HARDWARE AND METHOD

(75) Inventors: Thomas R. Mittan, Brookings, SD (US); Chad N. Gloege, Brookings, SD (US); Brett D. Wendler, Watertown, SD (US)

(73) Assignee: Daktronics, Inc., Brookings, SD (US)

( * ) Notice: Subject to any disclaimer, the term of this patent is extended or adjusted under 35 U.S.C. 154(b) by 0 days.

(21) Appl. No.: 10/965,133

(22) Filed: Oct. 14, 2004

(51) Int. Cl.
*G09G 5/02* (2006.01)
(52) U.S. Cl. ..................................... 345/619; 345/589
(58) Field of Classification Search ................ 345/903, 345/619, 589; 362/612
See application file for complete search history.

(56) References Cited

U.S. PATENT DOCUMENTS

| | | | |
|---|---|---|---|
| 4,263,736 A * | 4/1981 | Beierwaltes et al. | 40/452 |
| 4,539,598 A * | 9/1985 | Dietrich et al. | 348/319 |
| 4,751,446 A * | 6/1988 | Pineda et al. | 345/601 |
| 4,839,726 A * | 6/1989 | Balopole et al. | 348/536 |
| 5,079,636 A * | 1/1992 | Brody | 348/383 |
| 5,151,689 A * | 9/1992 | Kabuto et al. | 345/103 |
| 5,164,853 A * | 11/1992 | Shimazaki | 349/73 |
| 5,168,375 A * | 12/1992 | Reisch et al. | 382/250 |
| 5,363,318 A * | 11/1994 | McCauley | 702/85 |
| 5,399,390 A * | 3/1995 | Akins | 428/1.62 |
| 5,440,648 A * | 8/1995 | Roberts et al. | 382/141 |
| 5,523,769 A * | 6/1996 | Lauer et al. | 345/1.3 |
| 5,600,574 A * | 2/1997 | Reitan | 702/185 |
| 5,642,125 A * | 6/1997 | Silverstein et al. | 345/87 |
| 5,767,822 A * | 6/1998 | Hiroshi | 345/46 |
| 5,796,376 A * | 8/1998 | Banks | 345/82 |
| 5,805,117 A * | 9/1998 | Mazurek et al. | 345/1.3 |
| 5,815,168 A * | 9/1998 | May | 345/572 |
| 5,949,483 A * | 9/1999 | Fossum et al. | 348/303 |
| 5,949,581 A * | 9/1999 | Kurtenbach et al. | 359/621 |
| 6,054,968 A * | 4/2000 | De Matteo | 312/7.2 |

(Continued)

FOREIGN PATENT DOCUMENTS

GB 2164189 A * 3/1986

(Continued)

OTHER PUBLICATIONS

Gummi: a bendable computer Carsten Schwesig, Ivan Poupyrev, Eijiro Mori Apr. 2004 Proceedings of the SIGCHI conference on Human factors in computing systems CHI '04 Publisher: ACM Press.*

(Continued)

*Primary Examiner*—Javid A Amini
(74) *Attorney, Agent, or Firm*—Schwegman, Lundberg, & Woessner, P.A.

(57) ABSTRACT

A graphical display station of arbitrary shape such as channel letters or other shaped structures is populated with pixels which are components of flexible pixel strings which can be arranged to fit the arbitrary shape(s). The flexible pixel strings provide for straightforward and cost effective fabrication of channel letter or other shaped displays. The invention also includes pixel units which comprise lighting elements together with such control circuits as are needed to properly drive the lighting elements to form a graphical image. Addressing of the particular pixels is provided to accommodate the arbitrary arrangement of pixels of the flexible pixel strings. Methods of fabricating a channel letter display are also disclosed.

10 Claims, 12 Drawing Sheets

U.S. PATENT DOCUMENTS

| | | | | |
|---|---|---|---|---|
| 6,072,446 | A * | 6/2000 | Tokimoto | 345/56 |
| 6,169,632 | B1 * | 1/2001 | Kurtenbach et al. | 359/621 |
| 6,219,099 | B1 * | 4/2001 | Johnson et al. | 348/383 |
| 6,259,838 | B1 * | 7/2001 | Singh et al. | 385/31 |
| 6,330,111 | B1 * | 12/2001 | Myers | 359/599 |
| 6,335,728 | B1 * | 1/2002 | Kida et al. | 345/204 |
| 6,362,801 | B1 * | 3/2002 | Yuhara | 345/82 |
| 6,536,914 | B2 * | 3/2003 | Hoelen et al. | 362/231 |
| 6,628,258 | B1 * | 9/2003 | Nakamura | 345/98 |
| 6,809,390 | B2 * | 10/2004 | Toda et al. | 257/434 |
| 6,819,303 | B1 * | 11/2004 | Berger et al. | 345/1.1 |
| 6,842,164 | B2 * | 1/2005 | Imajo et al. | 345/98 |
| 7,049,983 | B2 * | 5/2006 | Azami et al. | 341/100 |
| 7,148,944 | B2 * | 12/2006 | Kinoshita et al. | 349/158 |
| 7,161,558 | B1 * | 1/2007 | Eidem et al. | 345/3.1 |
| 7,295,362 | B2 * | 11/2007 | Meisburger | 359/290 |
| 7,417,251 | B2 * | 8/2008 | Iketsu et al. | 257/72 |
| 2001/0015709 | A1 * | 8/2001 | Imajo et al. | 345/87 |
| 2001/0049893 | A1 * | 12/2001 | Maas et al. | 40/544 |
| 2002/0000576 | A1 * | 1/2002 | Inukai | 257/202 |
| 2002/0051356 | A1 * | 5/2002 | Takahashi et al. | 362/31 |
| 2002/0088984 | A1 * | 7/2002 | Toda et al. | 257/99 |
| 2004/0004827 | A1 * | 1/2004 | Guest | 362/31 |
| 2004/0041800 | A1 * | 3/2004 | Daniels | 345/204 |
| 2004/0043139 | A1 * | 3/2004 | Daniels | 427/66 |
| 2004/0207581 | A1 * | 10/2004 | Miller | 345/82 |
| 2004/0235227 | A1 * | 11/2004 | Kawase | 438/158 |
| 2004/0239586 | A1 * | 12/2004 | Cok | 345/55 |
| 2004/0253896 | A1 * | 12/2004 | Yamazaki | 445/24 |
| 2005/0030321 | A1 * | 2/2005 | Anwar | 345/629 |
| 2005/0040962 | A1 * | 2/2005 | Funkhouser et al. | 340/815.4 |
| 2005/0046646 | A1 * | 3/2005 | Tobita | 345/690 |
| 2007/0148793 | A1 * | 6/2007 | Yoshida | 438/14 |
| 2008/0225143 | A1 * | 9/2008 | Joffer et al. | 348/280 |
| 2009/0021497 | A1 * | 1/2009 | Wendler et al. | 345/204 |
| 2009/0021529 | A1 * | 1/2009 | Wendler et al. | 345/619 |
| 2009/0021532 | A1 * | 1/2009 | Gloege et al. | 345/647 |
| 2009/0024867 | A1 * | 1/2009 | Gloege et al. | 714/3 |
| 2009/0024929 | A1 * | 1/2009 | Gloege et al. | 715/740 |

FOREIGN PATENT DOCUMENTS

WO    WO/2002/073298    *    9/2002

OTHER PUBLICATIONS

Seamless multi-projector display on curved screens Jeroen van Baar, Thomas Willwacher, Srinivas Rao, Ramesh Raskar May 2003 Proceedings of the workshop on Virtual environments 2003 EGVE '03 Publisher: ACM Press.*

* cited by examiner

FLEXIBLE PIXEL HARDWARE AND METHOD

CROSS REFERENCES TO RELATED APPLICATIONS

This patent application is related to patent application entitled "Flexible Pixel String Software and Method" filed on the same date, by the same inventors, attached as Appendix 1, and incorporated herein.

BACKGROUND OF THE INVENTION

1. Field of the Invention

The present invention relates to image displays and signage, and more particularly, to displays of custom or arbitrary shape. Such shaped displays include channel letter displays, logo or design displays, curved or round displays, or other arbitrary shaped or unusual aspect ratio displays.

2. Description of the Prior Art

Displays have become increasingly more sophisticated, progressing from monochrome incandescent and LED to color to moving or changing to video quality displays, and from smaller to larger size, and with more elaborate content and control and driving systems. Channel letter type displays have progressed from simple neon or fluorescent light displays to video type displays. The construction of modern video-type channel letter or arbitrary shaped displays is typically accomplished using standard rectangular grid video components. Such use of rectangular grid video components is awkward and wasteful, and in some implementations lacks the full desired effect that channel letter shaped video components could provide. However, the production of shaped video components in arbitrary shapes is expensive and inefficient at present. Further, the rectangular grid video components and control system can be inadequate for creating the custom shaped displays that are becoming increasingly desired. Thus, there is need for efficient and cost effective production of arbitrary shaped displays.

DEFINITIONS

By "addressing means" herein is meant hardware device for identifying a particular pixel, lighting element, or display element so that a display controller can send data to the particular pixel, lighting element, or display element among a group of multiple pixels, lighting elements, or display elements.

By "control circuit" herein is meant electronic circuit which receives data and changes the lighting output of one or more pixels or lighting elements.

By "display element" herein is meant a subsystem or portion of a display.

By "display" herein is meant a graphical image display device such as a video screen, electronic ticker, scoreboard, channel letter display, array or series of lights, visual output device.

By "flexible connection" herein is meant mounting, mechanical, or electrical components which attach to a pixel, lighting element, or display element to provide power, signal communication, or physical attachment.

By "lighting element" herein is meant components which generate or modify light, such as an LED, light bulb, neon light, phosphorescent component, cathode ray tube, liquid crystal display, backlight, laser, or optical fiber.

By "pixel string" herein is meant a set of pixels or other series of lighting elements.

By "pixel" herein is meant picture element, a set of one or more lighting elements which make up a single region of a graphical image.

By "power circuit" herein is meant an electric circuit which provides electrical power to drive one or more lighting elements.

SUMMARY OF THE INVENTION

The general purpose of the present invention is to provide a display in any arbitrary shape. Such a display can be useful for signage, presentation of video information, and so forth, in channel letters or other arbitrary shapes as are desired. Such a display could be adapted as a large graphical display, scoreboard, ticker, billboard, informational signage, or other configurations and applications. The flexible pixel string of the present invention is also well suited for other indoor or outdoor architectural lighting applications. For example, lighting elements mounted in a room, in, behind or on a wall, ceiling, floor, or divider, or lighting elements on a building or external structure, such as a walkway, pole or fence, could be configured with flexible pixel strings for efficient and versatile custom lighting effects. Flexible pixel strings can be used to locate lighting elements behind a glass wall, in ceiling tiles, in recessive fixtures, and so forth, providing individual access and control of individual lighting elements for specialized illumination effects or display of video data or other graphical information.

The basic concept underlying the present invention is similar to having a rope of decorative lights that would be mounted to a display of any shape, such as with the lights protruding through holes to be visible from the front of the display, and the flexible connections and wires hidden behind the display surface. By simply affixing the lights to any chosen locations on the display, any arbitrary shape can easily be fabricated.

According to one embodiment of the present invention, there is provided a video-capable display, including multiple pixels arranged in an arbitrary configuration, with lighting elements, control circuits, power circuits, and flexible connections.

According to another embodiment of the present invention, there is provided a flexible pixel string, including multiple control circuits, each driving at least one pixel, with flexible connections.

According to still another embodiment of the present invention, there is provided a display element, including a control circuit, at least one lighting element, addressing means and at least one flexible connection.

According to a further embodiment of the present invention, there is provided an electronic circuit which provides multiple levels of control for a pixel or other display element.

According to a still further embodiment of the present invention, there is provided a method of fabricating a flexible pixel string.

According to an additional embodiment of the present invention, there is provided a method of fabricating a display of arbitrary shape.

According to another additional embodiment of the present invention, there is provided a method of addressing a particular pixel on a flexible pixel string.

One significant aspect and feature of the present invention is the efficient utilization of the minimum number of lighting elements and other costly electronic components.

Another significant aspect and feature of the present invention is the flexible pixel string which provides for production of displays of any arbitrary shape.

Still another significant aspect and feature of the present invention is the multiple display elements which provide for distributed control of pixels and lighting elements.

Yet another significant aspect and feature of the present invention is the multiple electronic circuits providing individual control of a pixel or other display element.

A further significant aspect and feature of the present invention is the flexible connections which provide for any arbitrary arrangement of pixels or display elements.

A still further significant aspect and feature of the present invention is the addressing means for identifying a particular pixel or display element for activating the particular pixel or display element in the desired manner and timing even if the pixel or display element is part of a flexible pixel string with arbitrary shape and not part of a regular rectangular grid or array.

Having thus described embodiments of the present invention, it is the principal object of the present invention to provide a display in any arbitrary shape. Such a display can be useful for signage, presentation of video information, and so forth, in channel letters or other arbitrary shapes as are desired.

One object of the present invention is to provide an efficient and cost effective display.

Another object of the present invention is to provide a display with moving video capabilities.

Yet another object of the present invention is to provide displays that are curved, angled, channel letter, logo shaped, or otherwise shaped.

Still another object of the present invention is to provide a flexible pixel string which can be used as a component in a display with arbitrary shape.

A further object of the present invention is to provide a simple electronic circuit which can be used to control a single pixel or other display element.

A still further object of the present invention is to provide for addressing a particular pixel on a flexible pixel string.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
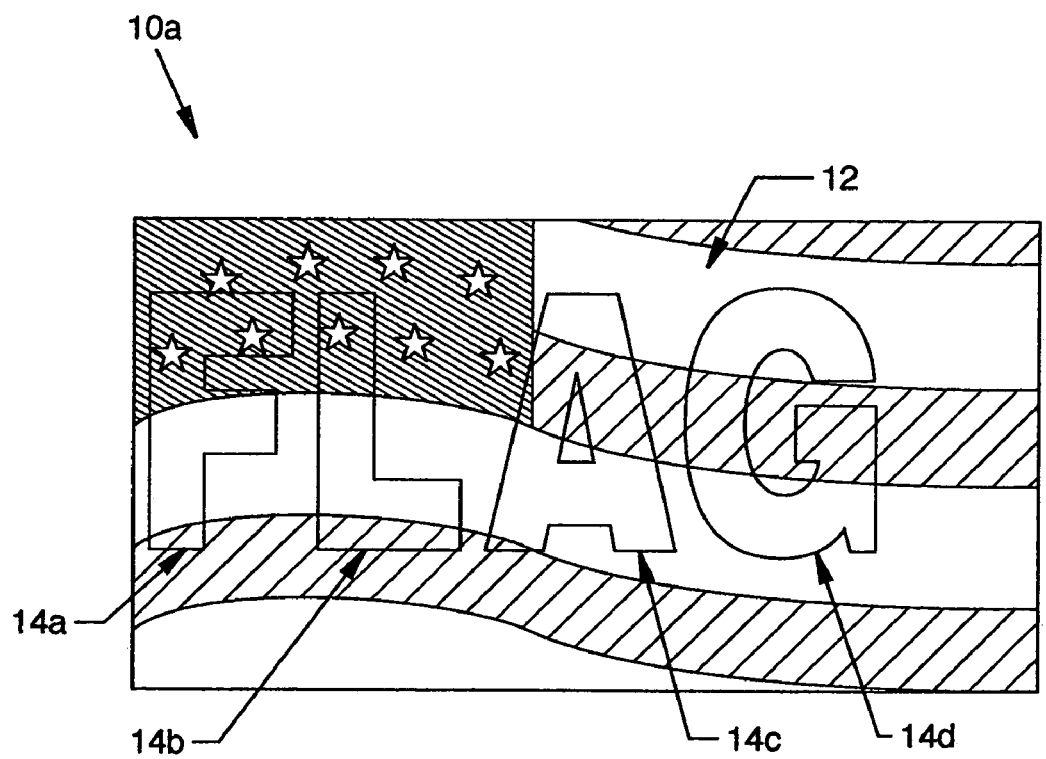
FIG. 1 illustrates a prior art display.
Figure 2:
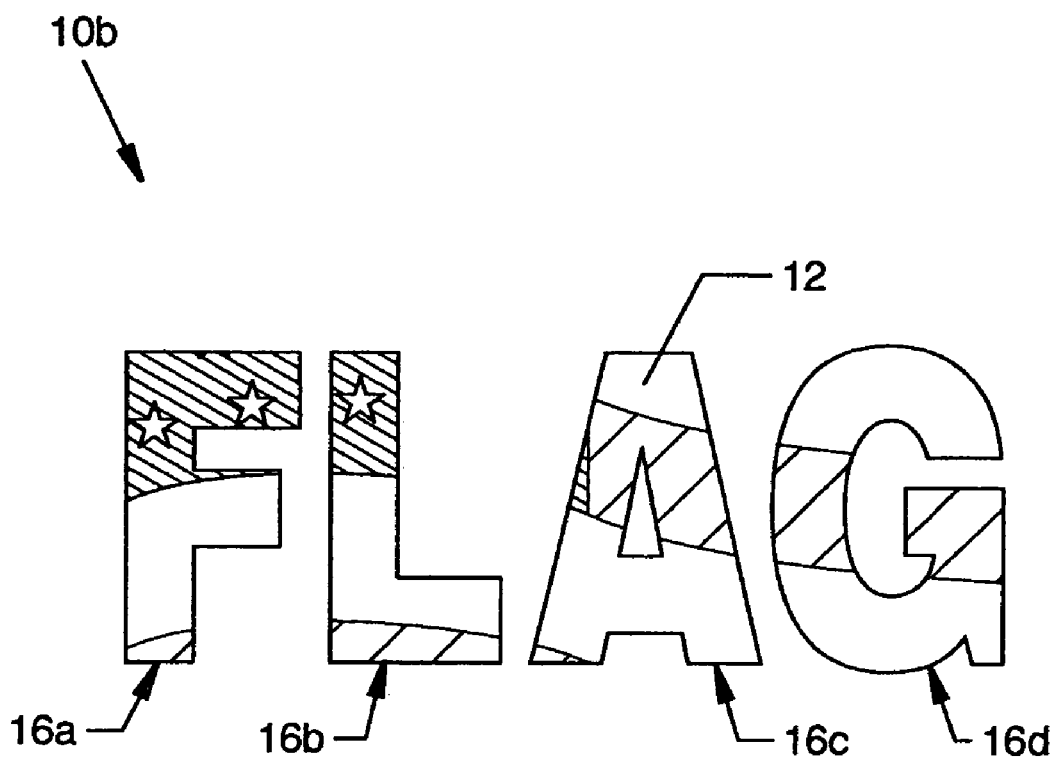
FIG. 2 illustrates a prior art display.

FIG. 1 and FIG. 2 illustrate prior art displays. Display 10a is a prior art rectangular grid display. Graphical image 12 fills display 10a. Letter shapes 14a-14d are displayed in an attempt to have the visual effect of a channel letter display. A display of this type lacks the visual effect of a true channel letter display. This prior art approach starts with display 10a and covers or removes those portions that are outside of letter shapes 14a-14d. In FIG. 2, still another prior art approach is to fabricate channel letters 16a-16d using rectangular grid components. These alternate prior art approaches might produce channel letter displays with the general appearance of FIG. 2, which illustrates a display 10b having channel letters 16a-16d and displaying graphical image 12. These alternate prior art approaches require significant custom fabrication and are not always even feasible, depending on the particular display type.

Figure 3:
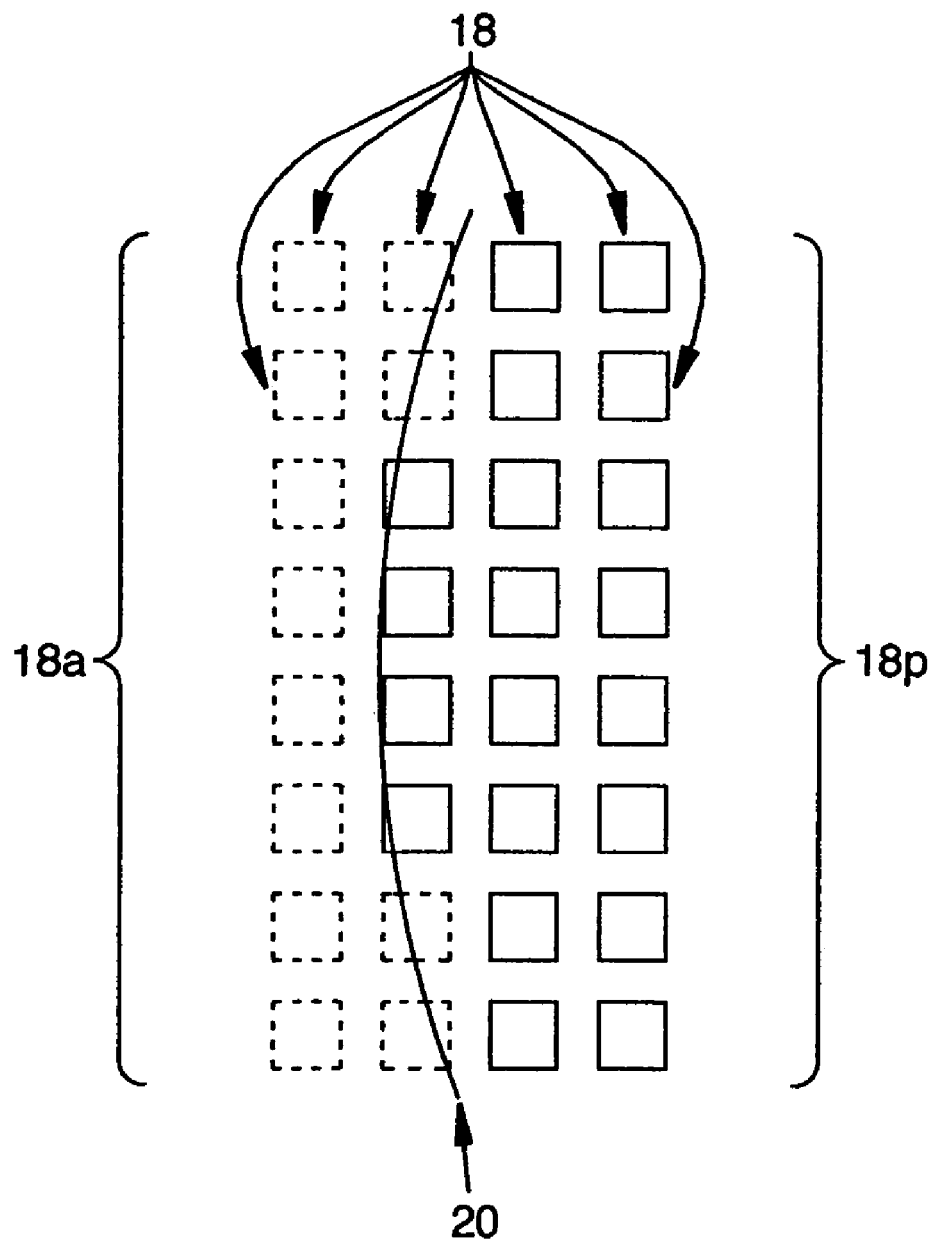
FIG. 3 illustrates an enlarged portion of the channel letter display of FIG. 2.

FIG. 3 illustrates an enlarged portion of the prior art display 10b of FIG. 2. A rectangular grid of pixels 18 is shown, with pixels 18p present in the display 10b (shown with solid lines), and pixels 18a which are absent or have been removed or covered (shown with dashed lines). Line 20 indicates the desired edge of a channel letter 16 of display 10b.

Figure 4:
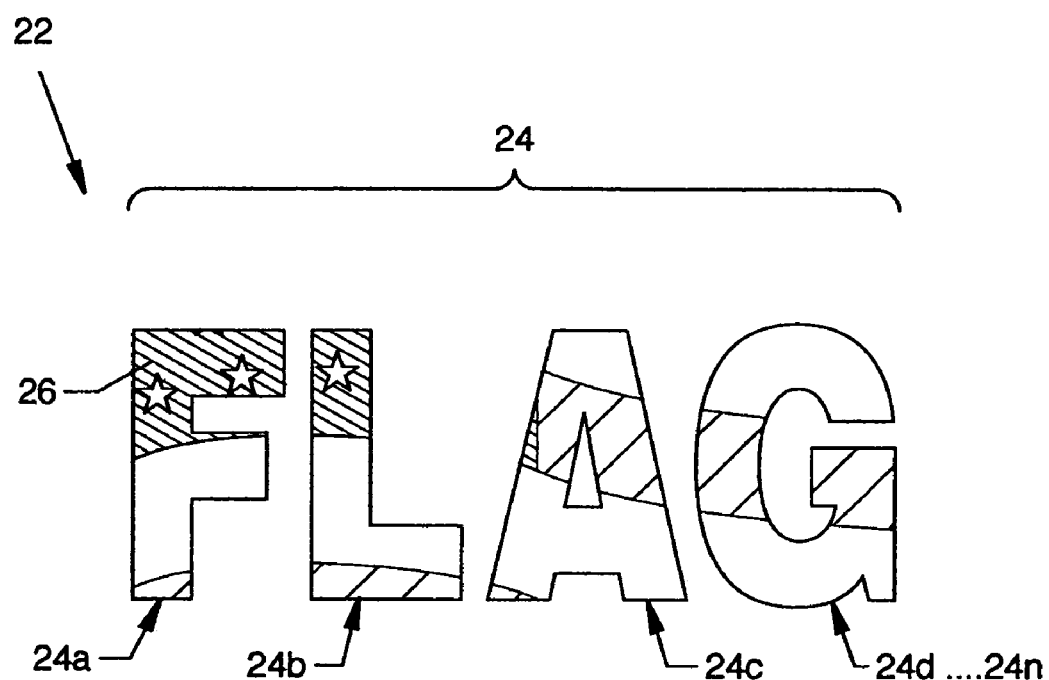
FIG. 4 illustrates a channel letter display with flexible pixel strings, the present invention.

FIG. 4 illustrates a channel letter display 22 with flexible pixel strings, the present invention, including shaped structure(s) 24. Although appearing similar to the prior art display of FIG. 2, the display of FIG. 4 is distinct in the manner in which it is produced and due to the presence of flexible pixel strings instead of prior art rectangular gridded pixels. Illustrated shaped structure(s) 24 can be channel letters 24a-24d or can be logo shapes, figure shapes, circular or curved shapes or sections, linear shapes, outlines, patterns, or combinations thereof. Channel letters 24a-24d spelling a company name, product name, place name, or other word or phrase may be desired. The channel letter display 22 can be a single shaped structure or can be multiple shaped structures 24, as shown. In this example, the shaped structures 24 are channel letters 24a-24d and the word "flag" is used for the channel letters 24a-24d and a graphical image 26 of a flag fills channel letters 24a-24d. In use, graphical image 26 may be any variety of images, designs, and so forth. For example, a moving (or animated) video image of a flag waving in the breeze could be "played" on channel letter display 22.

Figure 5:
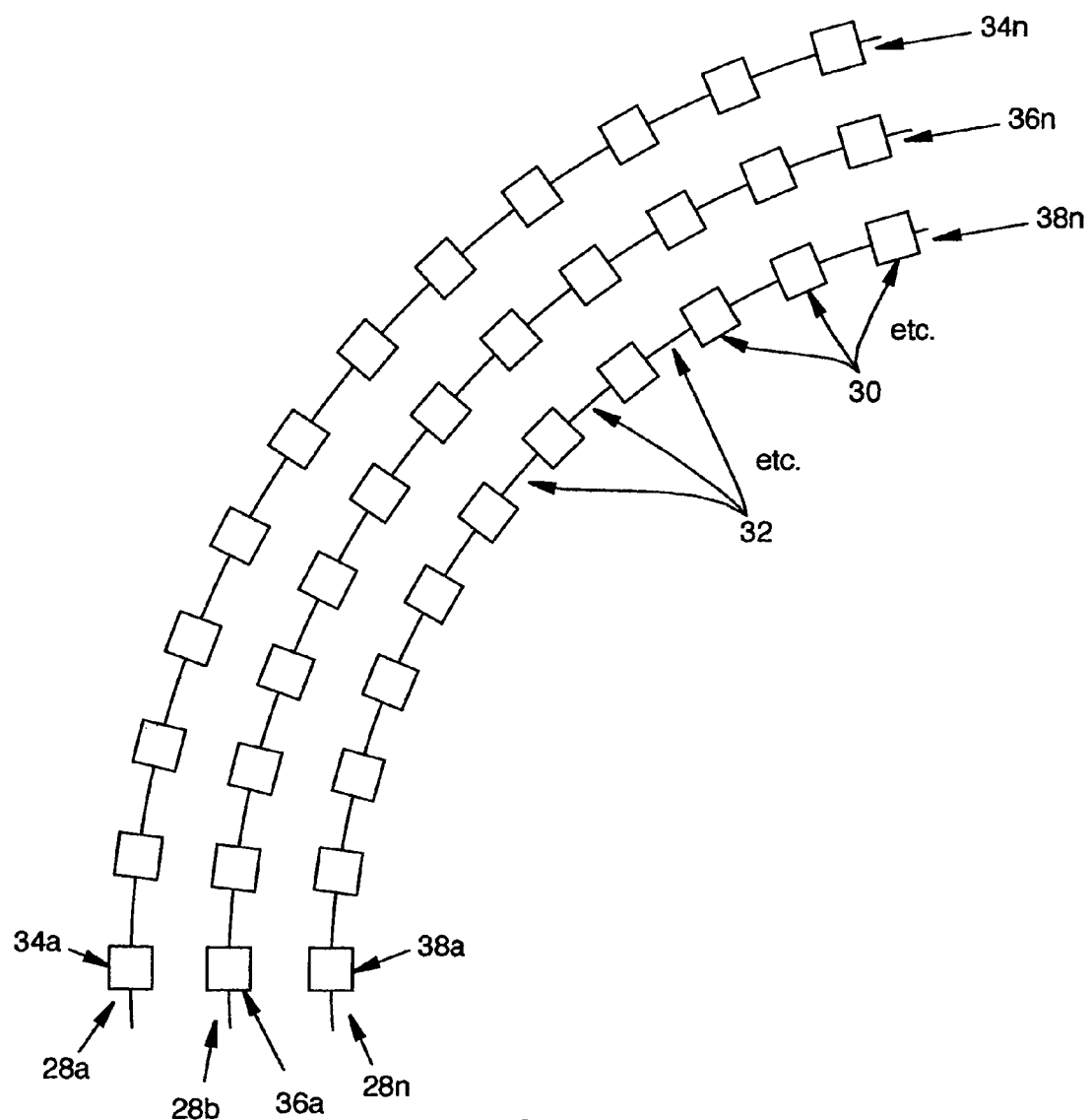
FIG. 5 illustrates an enlarged portion of the channel letter display of FIG. 4.

FIG. 5 illustrates an enlarged portion of the channel letter display 22 of FIG. 4. Portions of three flexible pixel strings 28a, 28b and 28n are shown. Each channel letter 24a-24d comprises at least one pixel 30, but typically comprises many pixels. The individual pixels in each channel letter 24a-24d are in flexible pixel strings 28a-28n which are curvilinear strings with flexible connections 32 and arranged, by individual strings or group of strings, to form the shape of the channel letter or shaped structure(s) 24. Any convenient number of pixels 30 can be used in the flexible pixel strings 28a-28n, and the number of pixels can vary from string to string.

Flexible pixel string 28a comprises pixels 34a-34n where n is the number of pixels in the flexible pixel string 28a. Similarly, flexible pixel string 28b comprises a number of pixels 36a-36n, where the number of pixels may be the same as or different from the number of pixels in flexible pixel string 28a. Still similarly, flexible pixel string 28n comprises a number of pixels 38a-38n, where the number of pixels may be the same as or different from the number of pixels in flexible pixel strings 28a and 28b. The flexible pixel strings 28a-28n may be formed into lines, curves, zig zags, or other pattern or shape as needed to form the channel letter or shaped structure 24 as desired, and the flexible pixel strings 28a-28n may terminate at any point within or at the periphery of the channel letter or shaped structure.

Figure 6:
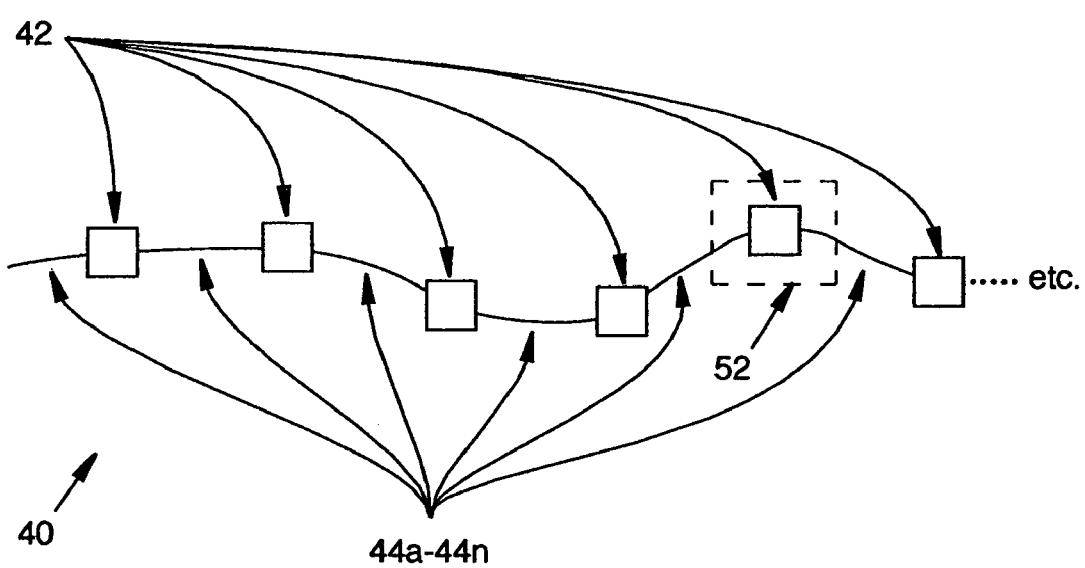
FIG. 6 illustrates a flexible pixel string.
Figure 7:
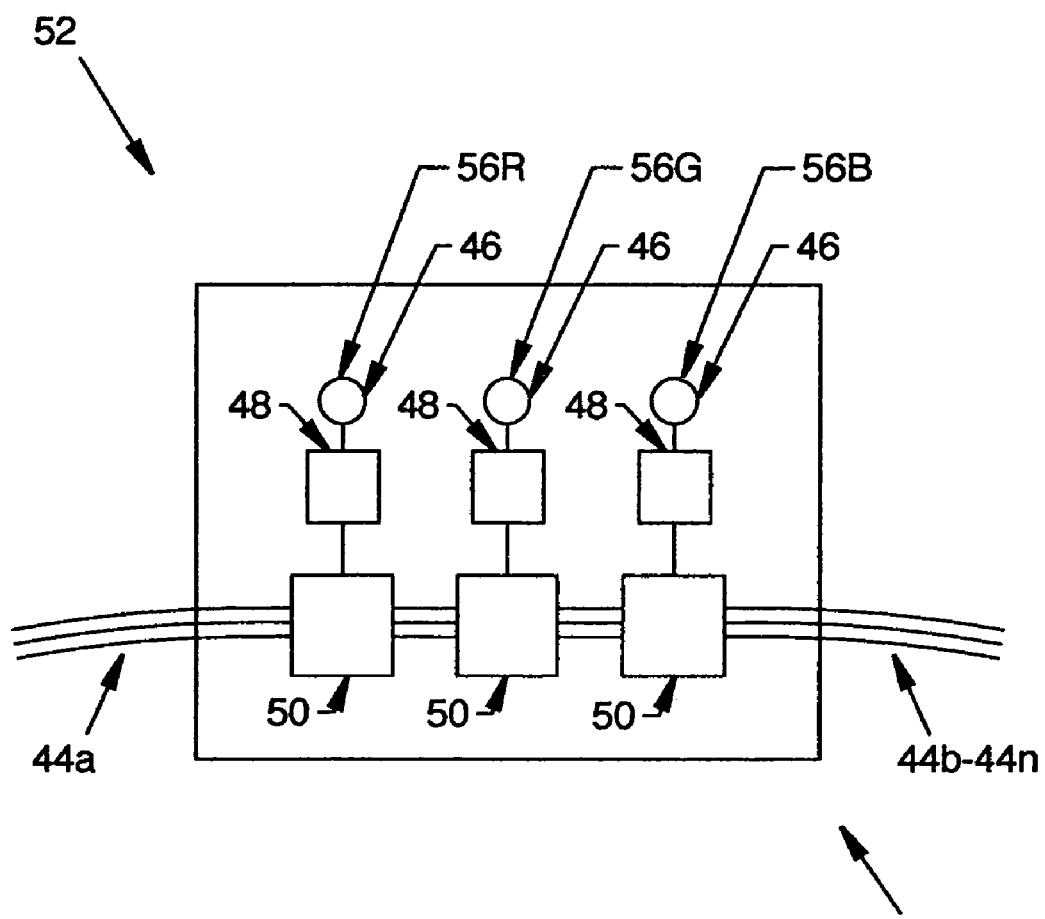
FIG. 7 illustrates schematically a pixel unit of FIG. 6.

FIG. 6 and FIG. 7 illustrate a flexible pixel string 40, similar to flexible pixel strings 28a, 28b and 28n of FIG. 5. Flexible pixel string 40 comprises at least one pixel 42 and at least one flexible connection 44a-44n. Preferably, the flexible pixel string 40 has multiple pixels 42 as shown. Each pixel 42 has lighting element(s) 46 (FIG. 7) as required for the type of display; for example, red, green, and blue light emitting diodes (LEDs) (i.e., 56R, 56G, 56B, respectively) with drive circuits 48 and control circuits 50 which could be combined into pixel unit 52 and connected with flexible connections 44a-44n. Other types of lighting elements with appropriate drive circuits could be used, such as incandescent or other lights, lasers, monochrome lights, liquid crystal elements, and so forth.

In the preferred embodiment, for each pixel 42, a simple control circuit 50 is included, physically attached to the pixel 42. Each flexible pixel string 40 has one or more control circuit 50/lighting element(s) 46 combinations connected in series by flexible connections 44a-44n. Flexible connections 44a-44n include electrical, data, or activation connections which pass electrical power, graphical image data, or other activation mechanism to and from the pixel units 52. Flexible connections 44a-44n also include mounting or attachment connections which provide for the pixel unit 52 to be affixed in the desired arbitrary location. A single component flexible connections 44a-44n may provide both the data connection and the mounting connection, or multiple flexible connections 44a-44n may be used, distributing the data connection, mounting connection, and other connection functions among the multiple flexible connections 44a-44n.

FIG. 7 illustrates schematically a pixel unit 52 of FIG. 6. This example indicates lighting elements 46 which comprise red LED 56R, green LED 56G, and blue LED 56B. Each LED has a corresponding LED drive circuit 48. Each drive circuit 48 has a corresponding control circuit 50 which receives data from and through a flexible connection, for example, flexible connection 44a. If pixel unit 52 is not the last pixel unit in the flexible pixel string 40, then control circuit 50 also passes data to flexible connection 44b. In this example, flexible connection 44a and flexible connection 44b include data cables which pass image data, clock or timing signals, data latch signal, and may pass other data or electrical power as well. Control circuit 50 includes logic elements as are needed to properly activate the corresponding LED 56R, 56G or 56B, such as comparators, counters, clocks, timers, latches, and so forth, by creating, for example, a pulse width modulation (PWM) function used to control the lighting intensity, duration, and timing for the corresponding LED. An integrated circuit 58 which comprises some or all of the elements of pixel unit 52 can be used advantageously to provide for easy and cost effective fabrication of shaped structure(s), including channel letters 24a-24d, in display 22, such as that of FIG. 4.

Figure 8:
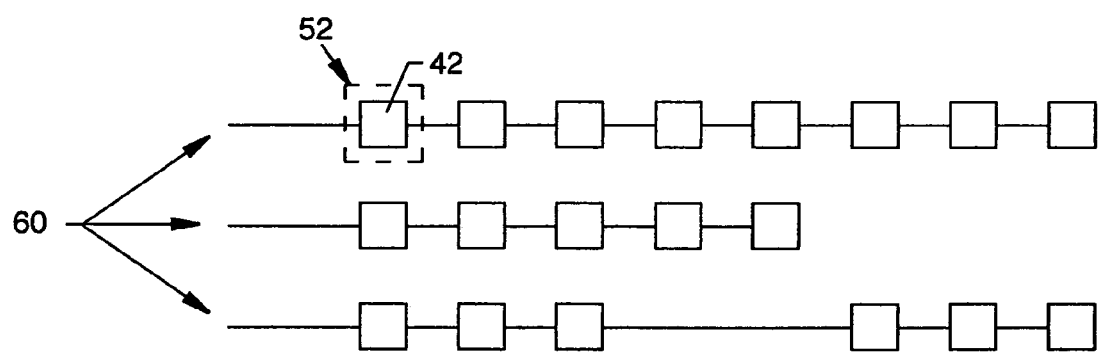
FIG. 8 illustrates prefabricated flexible pixel strings.

FIG. 8 illustrates standard or prefabricated pixel strings 60 with particular numbers and spacing of pixels 42 to facilitate construction of one or more channel letters 24a-24n of the shaped structure display 24. One would simply choose appropriate pixel strings to combine into the particular channel letter or shaped structure being constructed.

Figure 9:
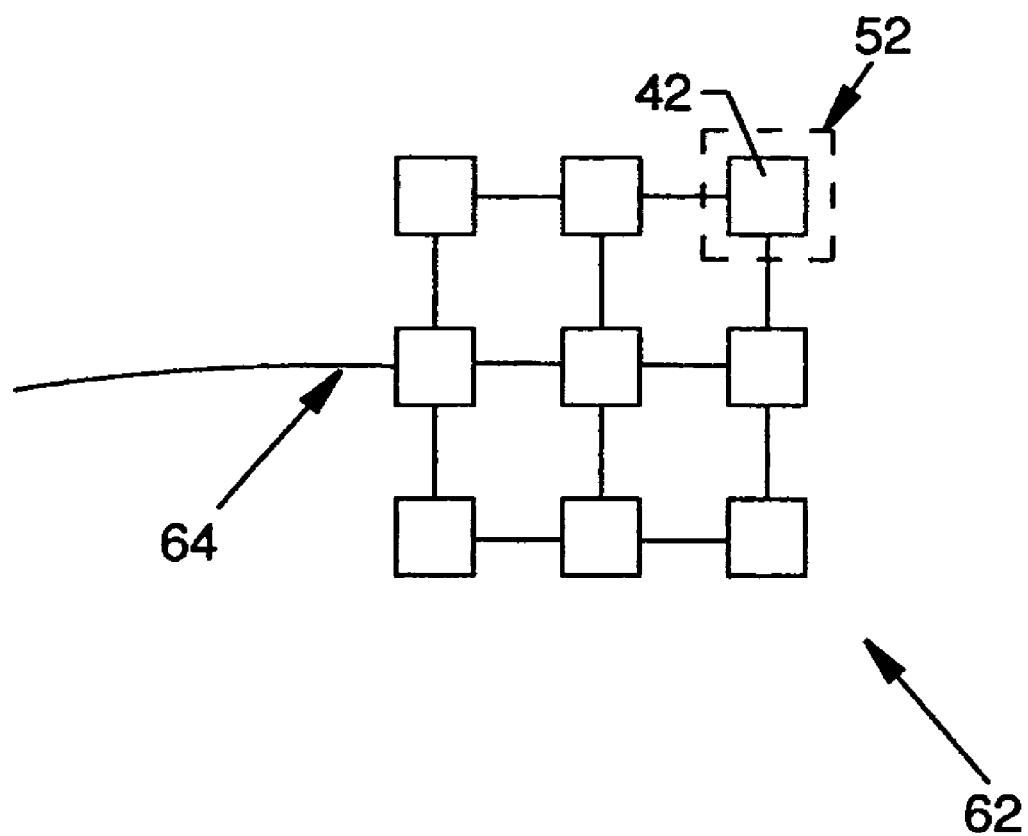
FIG. 9 illustrates a display element.

FIG. 9 illustrates display element 62. Display element 62 has some similarity to the prefabricated pixel string 60, but utilizes arrangements which could be a conventional rectangular grid of pixels 42 and pixel units 52 or arbitrary shaped pixel units 52 but with at least one flexible connection 64. Thus, the display element 62 may be positioned and oriented as needed to form a desired shaped structure 24, but does not have exclusively flexible connections between each pixel unit 52. The entire display element 62 is then used as a component, and multiple display elements 62 are used to create a shaped structure display 24 which could include a channel letter 24a-24d or which could be of some other shape.

Figure 10:
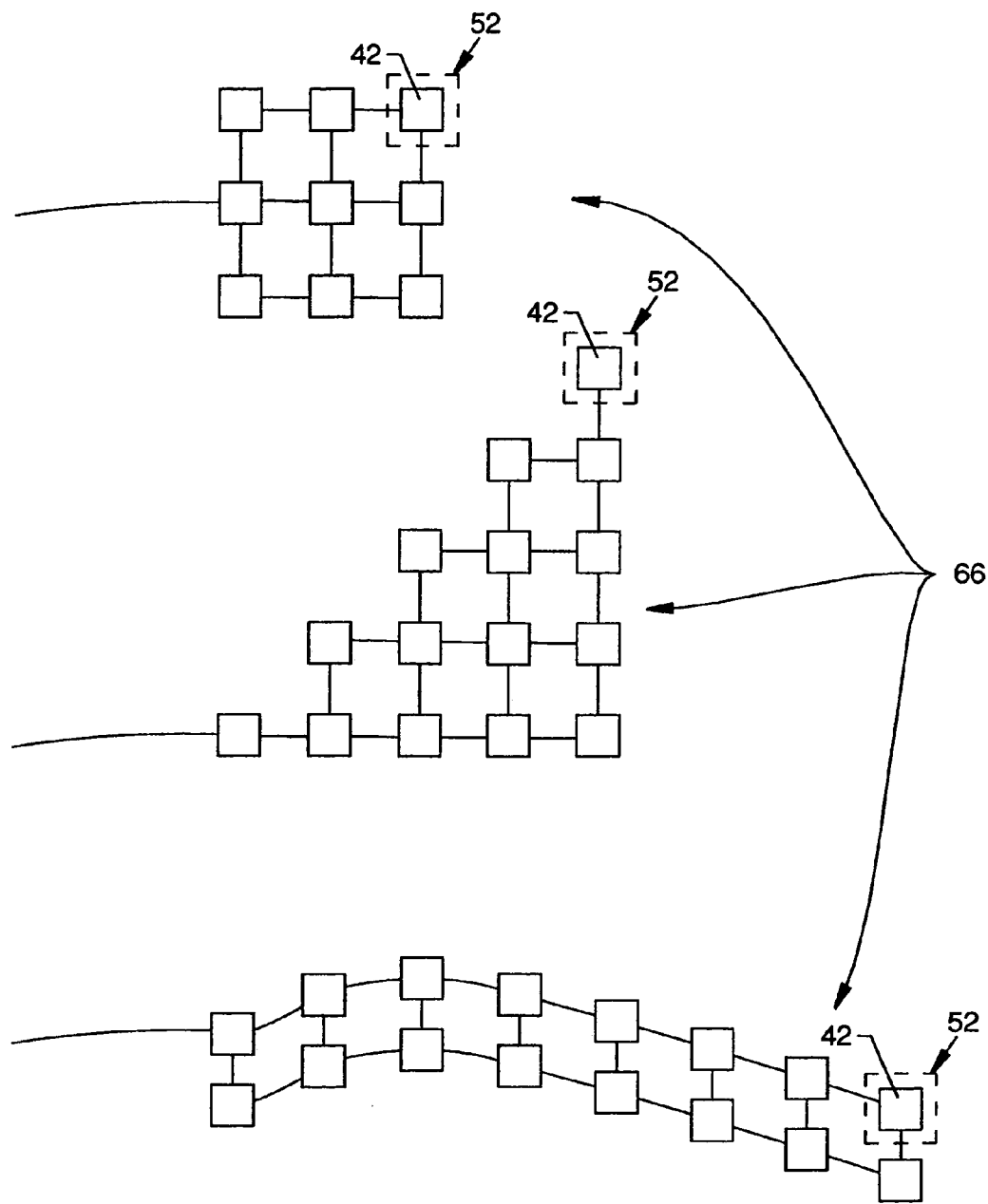
FIG. 10 illustrates prefabricated display elements.

FIG. 10 illustrates prefabricated display elements 66 with particular numbers and orientation of pixels 42 and pixel units 52 to facilitate construction of a shaped structure display 24 which can include a channel letter 24a-24d. One would simply choose appropriate display elements 66 to combine into the shaped structure 24 being constructed. A particularly advantageous approach is to utilize prefabricated display elements 66 together with flexible pixel strings 40 or prefabricated flexible pixel strings 60 to construct a shaped structure display 24 quickly and cost effectively. An additional advantageous aspect of the present invention is that the display element can be easily scaled up or scaled down in size and number of pixels. For example, the pixel unit or display element may comprise one full-color RGB or monochrome lighting element, or it can be scaled up so that each element on the flexible pixel string is an array of pixels. For instance, 2×2, 3×3, 4×4, 8×8, 16×16, 32×32, or other sized array of pixels or lighting elements can be incorporated or substituted for individual pixels or display elements. A large outdoor display could then comprise a string of large pixel arrays. The present invention provides for the utilization of large or small or intermixed pixel arrays or other shaped display elements. A particular flexible pixel string could incorporate a single pixel, a 4×4 pixel array, and a 32×32 pixel array, on the same pixel string. The hardware protocol is optimized to allow such variation, and corresponding software is optimized to enable such variation and substitution by allowing a library of pixel arrays and display elements to be created and saved. One may then simply choose and select the different pixel arrays and display elements desired, aided by software tools.

Figure 11:
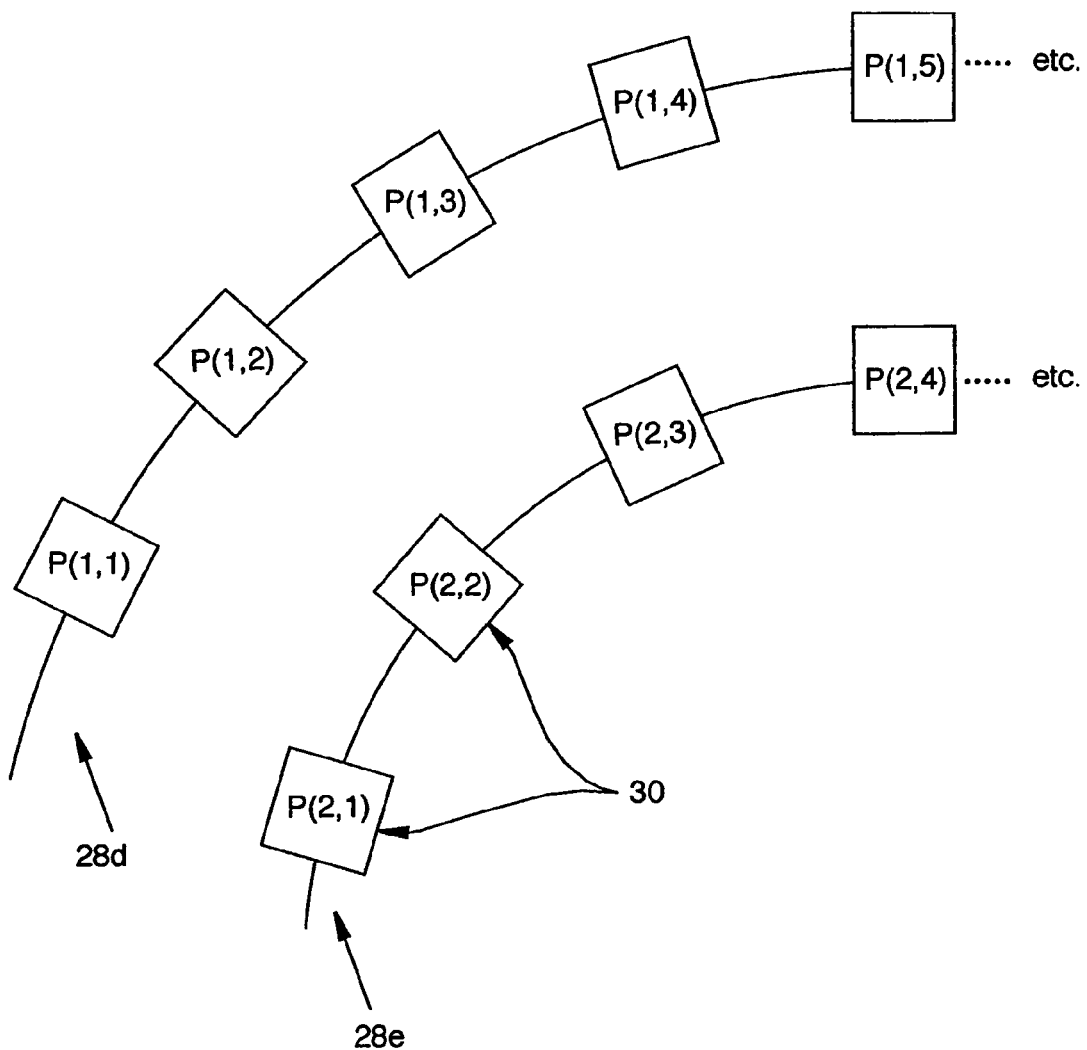
FIG. 11 illustrates schematically the addressing of pixels.

FIG. 11 illustrates schematically the addressing of pixels. Portions of flexible pixel strings 28d and 28e of channel letter display 22 are shown. Flexible pixel strings 28d and 28e are assigned a logical row to identify each flexible pixel string 28d and 28e. Within each flexible pixel string 28d and 28e, each pixel 30 is assigned a logical column to uniquely address each pixel 30. In this manner, each pixel 30 is uniquely addressable so that display controller 68 (FIG. 12) can send an image data set which will pass the appropriate image data to each pixel 30 to create a desired image even though the pixels 30 are not arranged in a standard rectangular grid arrangement. Pixels 30 on FIG. 11 are further denoted by the letter "P" in the form P(r,c), where r and c indicate a unique address.

Graphical image data 72 can be mapped from a standard rectangular array onto the logical row and logical column arrayed flexible pixel string 28a-28b by software. The software can accommodate scaling of data from single pixels to larger pixel arrays, such as 2×2 or 32×32 or other size pixel array, and may provide for creation and use of a library of pixel arrays and other display elements, and assist a user in selecting display elements and performing the image data mapping for the chosen display elements. Data, typically including graphical image data 72, timing data, and addressing data, are sent from display controller 68 to the shaped structure display 22, so that the shaped structure display 22 can display graphical image 26 as desired. Data sent to the shaped structure display 22 can comprise any variety of information, but typically includes any combination of color, hue, intensity, duration, timing, clock signal, and addressing data.

MODE OF OPERATION

Figure 12:
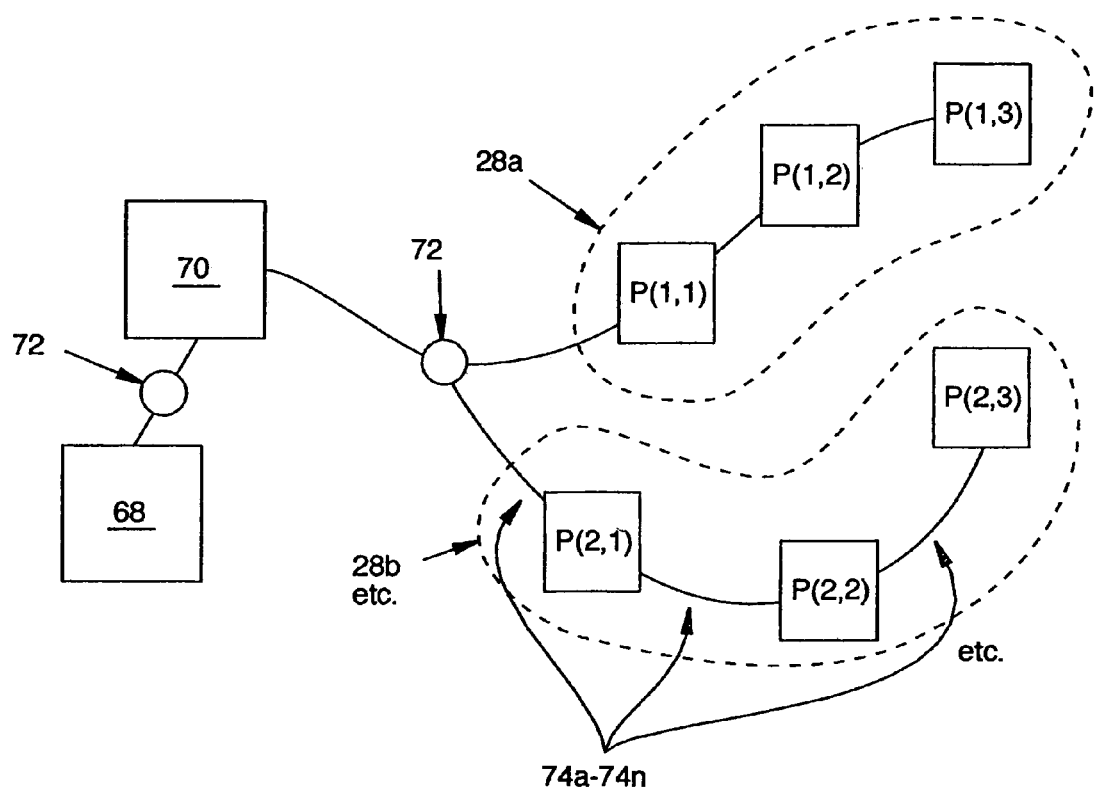
FIG. 12 illustrates schematically the operation of a graphical display station with channel letter or shaped structure display(s) having flexible pixel strings.

FIG. 12 illustrates schematically the operation of a graphical display station with shaped structure display(s) 22 having flexible pixel strings 28a-28n. Display controller 68, which may receive data from any data source (not shown), sends corresponding graphical image data 72 to software 70 which maps the graphical image data 72 onto logical rows and columns of pixels P(1,1) to P(n,m) where n refers to the number of logical rows and m refers to the number of logical columns in each logical row. Note that the number of logical columns may vary among the various logical rows. Graphical image data 72 passes via flexible connections 74a-74n to pixels P(1,1) to P(n,m) of flexible pixel strings 28a-28n. Pixels P(1,1) to P(n,m) comprise pixel units 52 which comprise control circuits 50 and lighting elements 46, as previously described in FIG. 7. Control circuits 50 receive graphical image data 72 and cause lighting elements 46 to activate at the lighting color, intensity, and timing corresponding to the graphical image data 72 for the particular pixel. Graphical image data 72 passes via the next flexible connections 74a-74n to the next pixel units in the flexible pixel strings 28a-28n and so forth so that every pixel unit in every flexible pixel string receives graphical image data 72 and activates accordingly to create graphical image 26.

The foregoing description and accompanying drawings is offered as illustration of the invention and not as a limitation. The scope of the invention is intended to be defined by the following claims and equivalents. One of ordinary skill in the art will appreciate that other variations and modifications of the invention described herein can be included within the scope of the present invention. Various features of the invention are grouped together in the several embodiments for illustration; this grouping is not to be interpreted as reflecting an intention that the embodiments of the invention require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Various modifications can be made to the present invention without departing from the apparent scope thereof.

It is claimed:

| FLEXIBLE PIXEL STRING HARDWARE AND METHOD PARTS LIST | |
|---|---|
| 10a | display, prior art |
| 10b | display, prior art |
| 12 | graphical image |
| 14a-d | letter shapes |
| 16 | channel letter |
| 16a-d | channel letters |
| 18 | rectangular grid of pixels |
| 18a | pixels |
| 18p | pixels |
| 20 | line |
| 22 | channel letter display |
| 24 | shaped structure |
| 24a-n | channel letters |
| 26 | graphical image |
| 28a-n | flexible pixel strings |
| 30 | pixels |

-continued

| FLEXIBLE PIXEL STRING HARDWARE AND METHOD PARTS LIST | |
|---|---|
| 32 | flexible connections |
| 34a-n | pixels |
| 36 | pixels |
| 38 | pixels |
| 40 | flexible pixel string |
| 42 | pixel |
| 44 | flexible connection |
| 44a-n | flexible connections |
| 46 | lighting element |
| 48 | drive circuits |
| 50 | control circuits |
| 52 | pixel unit |
| 56 | light emitting diodes (LEDs) |
| 56R | red LED |
| 56G | green LED |
| 56B | blue LED |
| 58 | integrated circuit |
| 60 | prefabricated pixel strings |
| 62 | display element |
| 64 | flexible connection |
| 66 | display elements |
| 68 | display controller |
| 70 | software |
| 72 | graphical image data |
| 74a-n | flexible connections |

The invention claimed is:

1. A graphical display assembly, comprising:
a plurality of flexible pixel strings, each flexible pixel string including a plurality of pixel units serially connected by a flexible connection, the flexible connection including one or more of electrical, data, or activation connections configured to pass electrical power or graphical image data to and from one or more of the pixel units, wherein each pixel unit includes at least one lighting element oriented to transmit light in a direction perpendicular to the viewing surface of the graphical display and at least one control circuit;
wherein the plurality of flexible pixel strings are arranged so that the plurality of pixel units are formed in a non-grid-like pattern to define an arbitrary shape configured into at least a portion of a channel letter display, wherein a periphery of the channel letter display is defined by a flexible pixel string adjacent a region having no pixels; and
wherein the channel letter display is configured to present multicolor, moving images.

2. The flexible pixel string of claim 1, wherein each pixel unit further includes at least one drive circuit.

3. The flexible pixel string of claim 1, wherein the one or more lighting elements include at least one red LED, at least one green LED, and at least one blue LED.

4. The graphical display assembly of claim 1, comprising a software module configured to map the graphical image data onto logical rows and columns for each pixel unit.

5. The graphical display assembly of claim 1, wherein a portion of the plurality of pixel units are arranged in a non-parallel manner.

6. A method of fabricating an arbitrary shape graphical display, comprising the steps of:
providing one or more flexible pixel strings having a plurality of pixel units and a plurality of flexible connections which pass data to the pixel units; and
forming one or more channel letters to be conveyed, including positioning the pixel units of at least one flexible pixel string into each channel letter wherein a periphery of the channel letter is defined by a flexible pixel string adjacent a region having no pixels, addressing the plurality of pixel units of the one or more flexible pixel strings, including defining a pixel array of at least two dimensions, with one dimension comprising a unique designation corresponding to each pixel string, and with another dimension comprising a unique designation corresponding to each pixel unit within the pixel string; and using the array to address each pixel unit in the display so that the particular graphical data for each pixel unit can be transferred to and received by each the pixel unit to form a graphical image.

7. The method of claim 6, comprising orientating at least one lighting element of each pixel unit to transmit light in a direction perpendicular to the viewing surface of the graphical display.

8. The method of claim 6, comprising positioning one or more filling pixel units within a confined spaced of at least one channel letter, the one or more filling pixel units configured to provide a moving or non-moving graphical image.

9. The method of claim 6, comprising individually controlling a selected pixel unit.

10. A graphical display assembly, comprising:

a plurality of flexible pixel strings, each flexible pixel string including a plurality of pixel units serially connected by a flexible connection, the flexible connection including one or more of electrical, data, or activation connections configured to pass electrical power or graphical image data to and from one or more of the pixel units, wherein each pixel unit includes at least one lighting element oriented to transmit light in a direction perpendicular to the viewing surface of the graphical display and at least one control circuit;

wherein the plurality of flexible pixel strings are arranged so that the plurality of pixel units are formed in a non-grid-like pattern to define an arbitrary shape configured into at least a portion of a channel letter display, wherein a periphery of the channel letter display is defined by a flexible pixel string adjacent a region having no pixels; and wherein a spacing between a first pixel unit and a second, consecutive pixel unit of a first flexible pixel string is greater than a spacing between a first pixel unit and a second, consecutive pixel unit of a second flexible pixel string.

* * * * *